United States Patent [19]
Schaff

[11] Patent Number: 5,729,147
[45] Date of Patent: Mar. 17, 1998

[54] HOUSING FOR SURFACE MOUNTABLE DEVICE PACKAGES

[75] Inventor: Robert J. Schaff, Phoenix, Ariz.

[73] Assignee: Aries Electronics, Inc., Frenchtown, N.J.

[21] Appl. No.: 517,918

[22] Filed: Aug. 22, 1995

[51] Int. Cl.$^6$ ............................................. G01R 31/02
[52] U.S. Cl. ........................................ 324/755; 324/757
[58] Field of Search ................................ 324/755, 754, 324/757; 439/66, 68

[56] References Cited

U.S. PATENT DOCUMENTS

| | | | |
|---|---|---|---|
| 3,377,514 | 4/1968 | Ruehlemann et al. | 324/158.1 |
| 4,329,642 | 5/1982 | Luthi et al. | 324/755 |
| 4,560,216 | 12/1985 | Egawa | 324/755 |
| 5,244,404 | 9/1993 | Kishi et al. | 439/331 |
| 5,453,700 | 9/1995 | Balyasny | 324/755 |
| 5,504,436 | 4/1996 | Okutsu | 324/755 |
| 5,541,525 | 7/1996 | Wood et al. | 324/755 |
| 5,557,212 | 9/1996 | Isaac et al. | 324/755 |

*Primary Examiner*—Ernest F. Karlsen
*Attorney, Agent, or Firm*—Anthony J. Casella; Gerald E. Hespos; Ludomir A. Budzyn

[57] ABSTRACT

The terminal contact beams of a test or burn-in socket are provided with an abrasive surface to remove oxides or other films from the contact pins, lands, etc., of an electronic device package. The burn-in or test socket is in the form of a housing which holds the electronic device package by its terminal feet to prevent damage to the device package or mis-alignment of the terminal feet and moves the feet with respect to the terminal contact beams to assure good electrical connection therebetween.

19 Claims, 4 Drawing Sheets

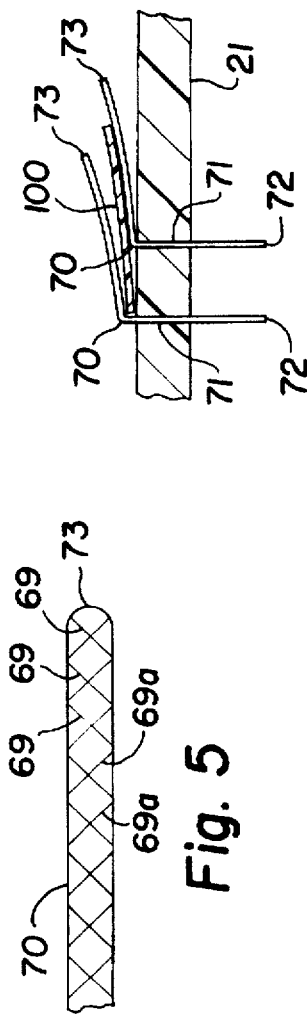
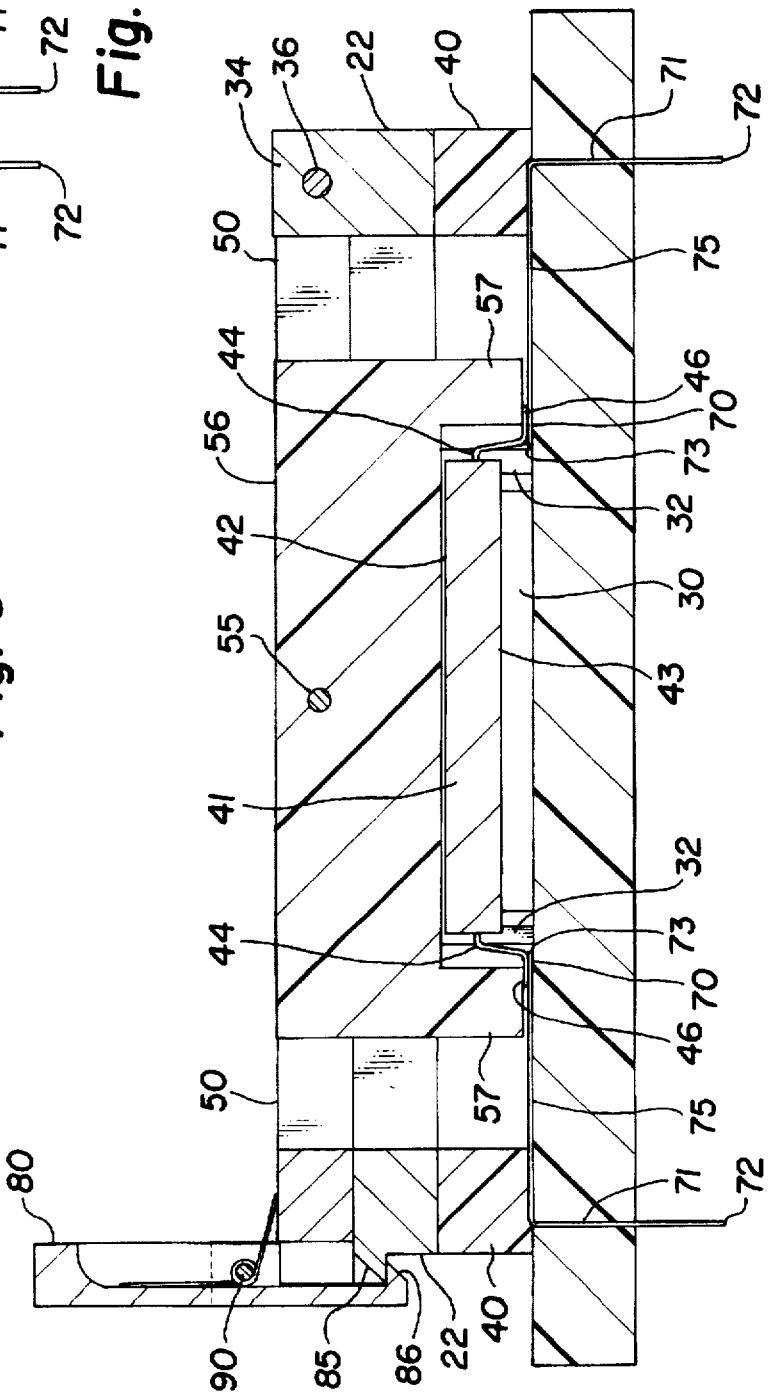

HOUSING FOR SURFACE MOUNTABLE DEVICE PACKAGES

This invention relates to electronic test equipment. More particularly, it relates to apparatus for temporarily mounting surface mountable electronic device packages and interconnecting the terminals or terminal leads extending from the packages with external circuitry while the device package is subjected to burn-in, testing or the like.

Surface mountable device packages take various forms. In the true leadless chip carrier package, terminal lands are arranged on one major face of the package in a pattern corresponding with mounting pads on the surface of a circuit board or the like. The device package is mounted on the circuit board by soldering the terminal lands to the mounting pads. Packages having a pattern of lands distributed over a major portion of one face thereof are sometimes called land grid array (LGA) packages. Similarly, packages having small solder bumps arranged in a pattern on one face for forming interconnections with external circuitry are usually referred to as ball grid array (BGA) packages. Other surface mount packages have small leads extending from one or more edges of the body of the package. The leads may extend outwardly in an "S" shape (commonly referred to as "gull-wing" leads) so that the end of each lead forms a foot lying in a common plane with other feet for surface mounting. Packages having leads extending from only from only one or two edges are commonly referred to as small outline (SOIC or SO) packages. When such small leads extend from all four edges, the package is usually referred to as a quad flat pak package. Leads extending from the sides of the package may extend outwardly, downwardly and then inwardly in a "J" shape (commonly referred to as "J" leads) so that the end of each lead is forced under a major face of the package and forms a foot lying in a plane parallel with the major face of the package.

All such packages share the ability to be mounted on the surface of a circuit board or the like by aligning the feet, balls, etc., with mounting pads on the surface of the mounting substrate and thus are referred to as "surface mount" packages. Such mounting arrangements avoid the use of holes in the circuit board and thus permit mounting of devices on both sides of the circuit board to conserve real estate on a circuit board or the like.

Irrespective of the particular type of device package, surface mount packages present a distinct testing problem. Because such packages have very small closely spaced leads, balls or terminal feet (all hereinafter collectively referred to as terminal feet) and because the lands, balls or terminal leads forming such terminal feet are uniformly closely spaced and extremely fragile, it is very difficult to secure surface mount packages in a test socket or the like without damaging and/or causing mis-alignment of the feet. Even if physical contact is formed, electrical contact may be prevented by oxide films or the like formed on the feet. Where the device packages must be stress tested (environmentally as well as electrically) the mounting apparatus must also withstand repeated use in hostile test conditions such as vibration, heat, etc., applied to such packages during burn-in and testing.

In accordance with the present invention, re-useable test socket or mounting support is provided which supports the device package in fixed relationship and electrical contact with external circuitry. The support housing comprises a base and alignment structure which maintains the device package in a predetermined orientation with respect to the housing. The housing includes a plurality of parallel, resilient, elongated electrically conductive terminal beams, each beam having one end secured to the base and a free end extending into the cavity defined by the alignment structure. The inwardly projecting portion of each terminal beam has a roughened or abrasive surface aligned to contact a terminal foot on the device package when the device package is positioned in the cavity.

A closure mechanism, preferably hinge-mounted to the alignment structure, urges the device package into the cavity and into contact with the inwardly projecting terminal beams. The closure mechanism, however, need not be mounted on the housing but may be part of the loading or other automatic handling equipment. The terminal beams, curved upwardly in the relaxed condition, are flattened by the pressure applied thereto by the closure. As the terminal beams are flattened, the roughened surfaces thereof are drawn across the feet (or other portions of the terminal leads with which they are in contact) causing the roughened surface to scrub the terminal feet to remove any oxide layer or other barrier which would interfere with good electrical contact. Since the terminal beams are resilient, they are readily flattened without placing substantial physical stress on the terminal feet yet exert sufficient force on the terminal feet to maintain good contact. When testing is completed, the closure is removed and the package can be removed without applying substantial force on the terminal feet. Thus testing, burn-in and the like can be performed without risk of physical damage to the device package. Because of the simple structure of the mounting support, however, reliable reuseability is assured. Various other features and advantages of the invention will become more readily understood from the following description taken in connection with the appended claims and attached drawing in which:

FIG. 4 is a cross-sectional view of the assembly of a complete mounting support of FIG. 1 shown in the closed position with a device package therein;

FIG. 5 is an enlarged top plan view of the end portion of a terminal beam illustrating micro-grooves formed therein; and FIG. 6 is a fragmentary sectional view of the base portion of a mounting housing which employs parallel rows of terminal beams.

Figure 1:
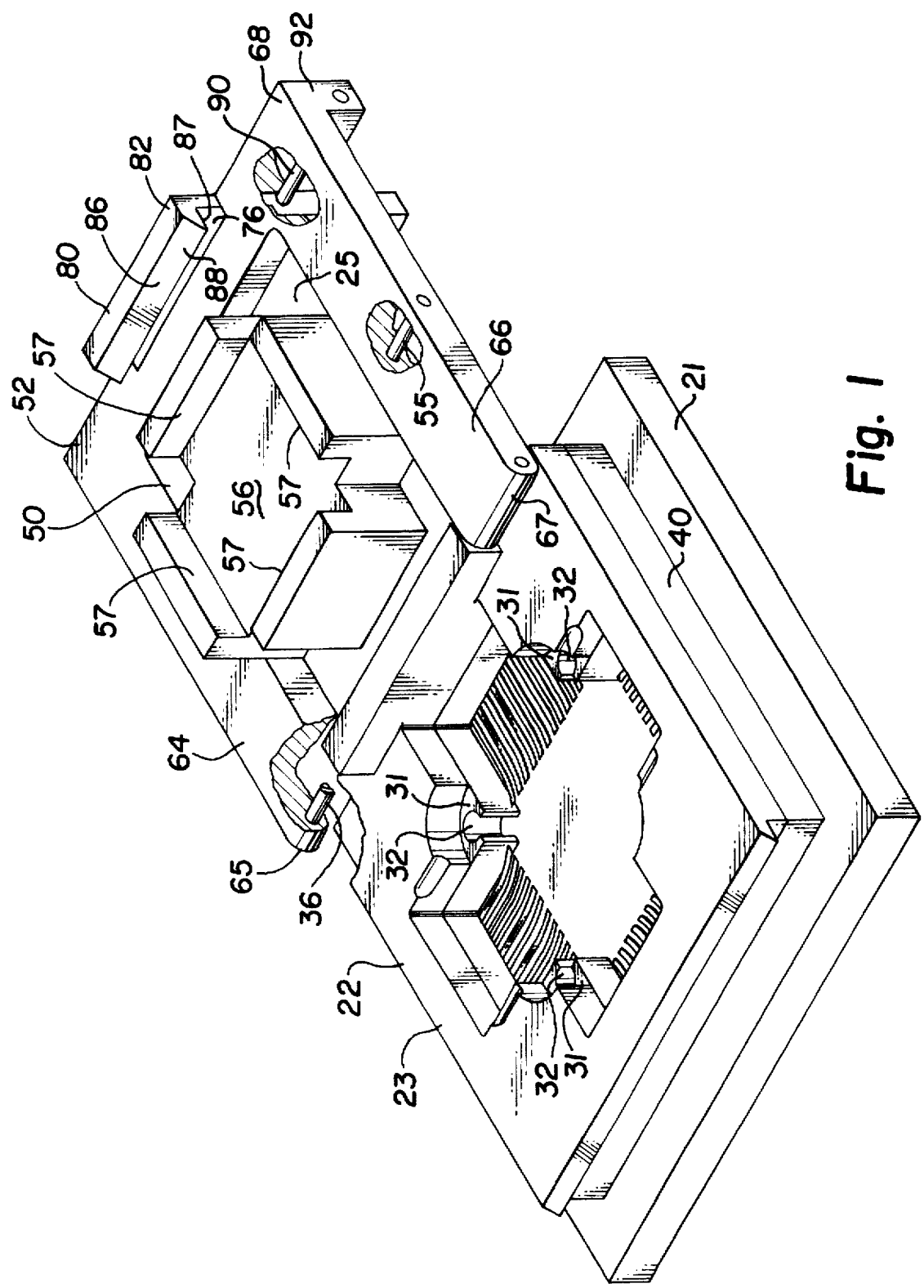
FIG. 1 is a perspective view of a preferred embodiment of the mounting support of the invention shown in the open position.

A burn-in socket for a quad flat pak package is shown and described herein to illustrate the principles of the invention. Like reference numerals are used to designate like or corresponding parts throughout the drawing. While only a single package type is illustrated, it will be recognized that the same features and principles can be applied to similar structures to accommodate other package forms.

FIG. 1 illustrates a mounting housing 20 in the form of a burn-in socket for a quad flat pak. Mounting housing 20 comprises a base 21, upper plate 22, lower plate 40, closure or lid 50 and a plurality of elongated terminal beams 70. Upper plate 22 and lower plate 40 are secured together to form a housing 23 which, in cooperation with base 21, defines a cavity 30. Closure 50 is hingedly secured to housing 23 and rotatable between an open position (shown) and a closed position (see FIG. 3). Alternatively, closure 50 may be separated from the housing 23 but cooperate therewith as described herein.

The cavity 30 is preferably generally rectangular in plan dimension and includes guide or alignment structure projecting into the cavity for guiding and aligning the device package with respect to the terminal beams 70. In the embodiment illustrated the alignment structure comprises bosses 31 projecting into the cavity from each corner thereof. Each boss 31 has a vertical groove 32, each of which is adapted to capture a corner of a quad flat pak inserted therein (see FIG. 3) and maintain the package in fixed orientation within the cavity 30 while permitting the device package to move freely in the vertical direction only. Obviously, housing 23 need not be made if two parts secured together. It may be manufactured as a single part with the cavity 30 and alignment structure 31 fabricated by any suitable means such as machining, milling, laser ablation or formed by molding, casting or the like.

Terminal beams 70 are formed of electrically conductive, resilient material such as beryllium-copper or steel and preferably coated with gold or the like to assure high flexibility, resiliency and electrical conductivity. The beams 70 are elongated ribbons having a first end 71 which is secured in (and passes through) base 21 to define a tail 72 for interconnection with external circuitry such as a burn-in board or the like. It will be recognized, of course, that first end 71 and tail 72 need not project through the base 21 but may be secured to the top face of base 21.

Figure 3:
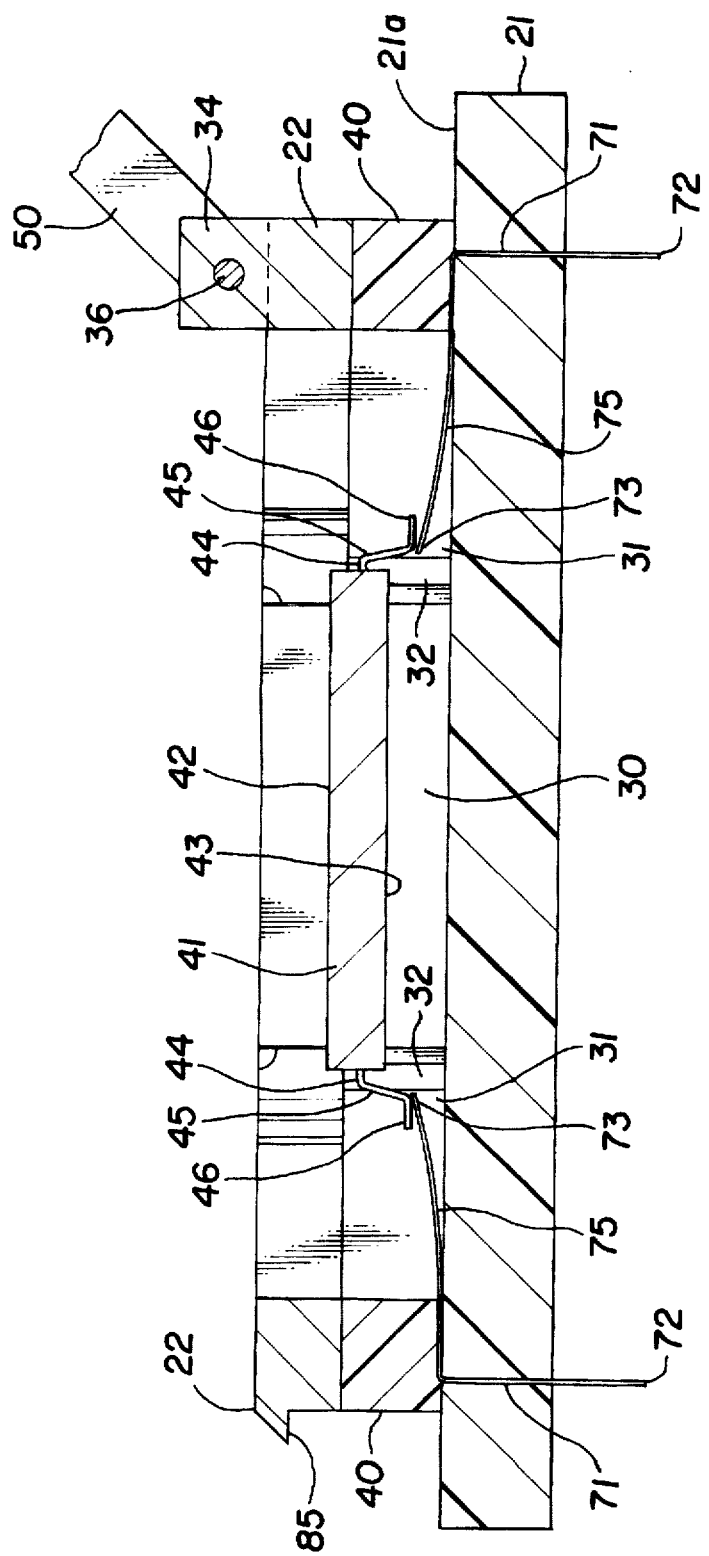
FIG. 3 is a cross-sectional view of the assembly of FIG. 2 taken along the line 3—3 with a device package in place.

As shown in FIGS. 3 and 4 each beam 70 has a 90° bend and is secured in the base 21 by housing 23. The second or free end 73 projects into the cavity 30. A mid-section 75 joins second end 73 with first end 71 and is curved so that each beam 70 extends upwardly from the floor (defined by base 21) into the cavity 30. Terminal beams 70 may be readily formed by stamping or the like using conventional materials and processes to form the beam 70 into the desired shape.

Figure 2:
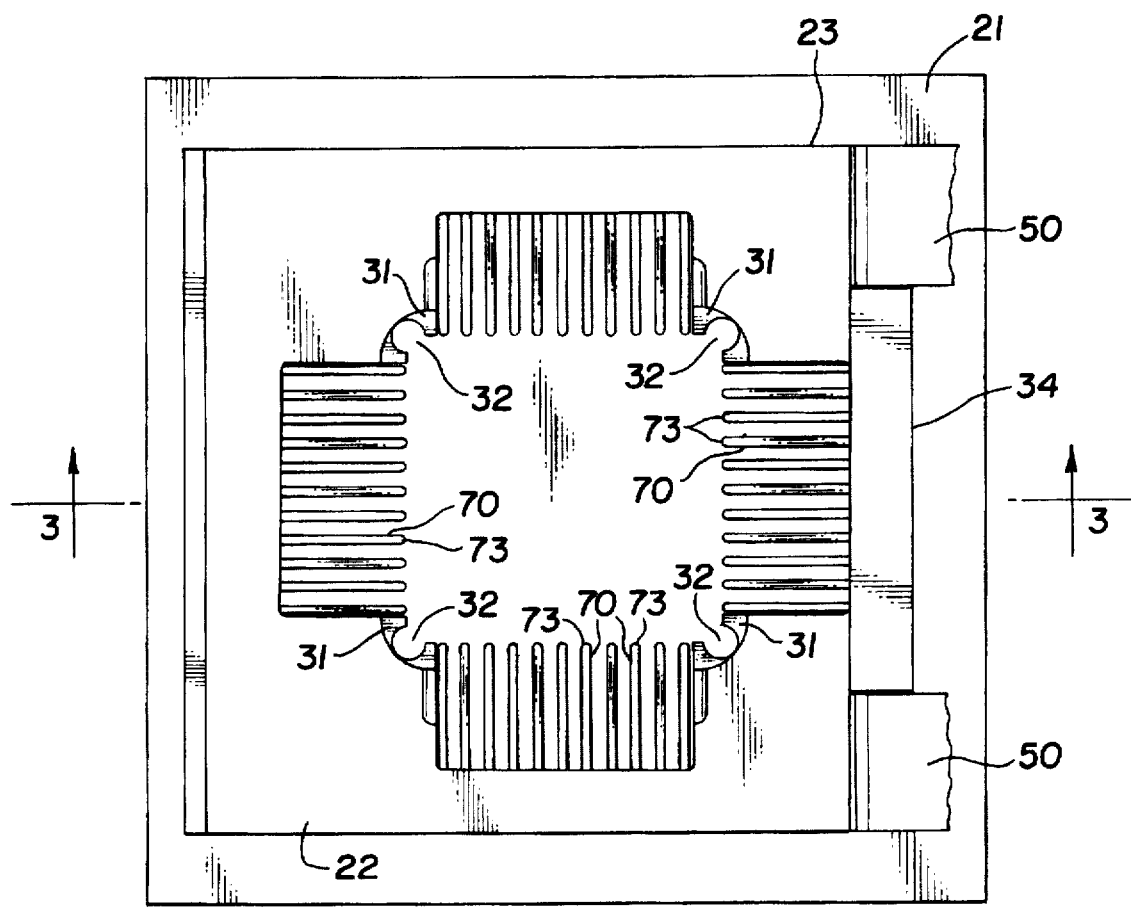
FIG. 2 is a top plan view of an assembly of the base and alignment structure of the mounting support of FIG. 1.

As more clearly shown in FIG. 2, the beams 70 are positioned and arranged to extend inwardly from the perimeter of cavity 30. Since the support housing of FIGS. 1 and 2 is intended for quad flat paks, beams 70 extend from all four edges and are arranged in groups of parallel beams. If an SOIC package is to be used, parallel beams need only project from two opposite sides. It will be recognized that the number, size and spacing between beams 70 will be determined by the number, size and location of the feet which are to be contacted. For clarity of illustration, FIG. 2 and FIG. 3 only show terminal beams 70 on two opposite sides of the cavity 30. In the embodiment illustrated, the beams 70 can be used to contact the feet in quad flat pak, SOIC, J-lead, gull-wing and leadless chip carrier packages since the beams are arranged to contact each of such feet arrangements from the bottom of the common plane occupied by the feet. Where the feet are arranged in rows spaced inwardly from the outer edge of the package (such as in BGA and LGA packages), beams 70 may be overlaid as shown in FIG. 5 so that the free ends 73 of one row of beams project farther than the first row. To prevent electrical shorting between overlaid beams, an insulating film 100 such as polyimide or the like is positioned between the beams 70.

The lid or closure 50 is formed by a frame 52 which has parallel arms 64 and 66 extending from opposite ends of a base 68 to form an opening 25 therebetween. A hinge pin 36 extends through the end portions 65 and 67 of the arms 64 and 66, respectively, to rotatably secure the lid 50 to a hinge block 34 extending from upper plate 22. The assembly of hinge pin 36 and hinge block 34 may incorporate a spring (not shown) to bias the lid 50 toward either the open position or closed position. End portions 65 and 67 may be rounded to provide clearance between the upper surface of upper plate 22 and the lid 50 as the lid rotates between the open and closed positions.

A recess 76 formed in the opposite end of base 68 is sized to receive and support latch plate 80 pivotally secured therein. Latch plate 80 (as viewed in FIG. 1) extends above and below the frame 52. First end 82 of latch plate 80 includes a latch hook 86 which has an angled or rounded camming surface 88 and a latch surface 89. The portions of base 68 on either side of the recess 76 form pin blocks 91 and 92 for latch pin 90 which secures latch plate 80 to the lid 50 and permits the latch plate 80 to rotate about the pin. The latch assembly may include a spring (not shown) to bias the latch to the closed position if desired.

A pressure plate 56 is pivotally supported between arms 64 and 66 (within the space defined by opening 25) by plate pin 55 passing transversely therethrough and journaled in arms 64 and 66. Pressure plate 56 has a boss 57 extending from each edge thereof. The bosses 57 are arranged to extend into the cavity 30 as described hereinafter.

A quad plat pak package 41 is loaded into the support housing of FIG. 1 as shown in FIGS. 3 and 4. The quad flat pak ordinarily comprises a rectangular package having a top face 42 and bottom face 43 with a plurality of terminal (gullwing) leads 44 extending laterally outwardly from the peripheral edges thereof (see FIG. 3). Leads 44 are "S" shaped to define knees 45 and outwardly extending feet 46. The undersurfaces of feet 46 all lie in a common plane substantially parallel with (and slightly spaced from) bottom surface 43 of the device package 41 to permit surface mounting.

The four corners of the device package are positioned in the vertical grooves 69 in bosses 31 to position and align the device package 41 within the mounting housing 20. In this position, the device package 41 is trapped within the alignment structure and can only move vertically. Each foot 46 is aligned within a free end 73 of a terminal beam 70. Since terminal beams 70 are all curved upwardly, the beams 70 support the device package 41 within the cavity 30 by contacting only the undersides of feet 46.

The housing 20 is closed to trap the device package by rotating lid 50 to the closed position as shown in FIG. 4 (or by other closure means). Bosses 57 on pressure plate 56 are spaced and aligned to contact only the top surfaces of feet 46. Thus, as the closure (lid 50) is moved to the closed position the bosses 57 uniformly press the feet 46 downwardly against the resilient curved terminal beams 70.

It should first be noted that the device package is supported by its terminal leads but no pressure (other than the weight of the device package 41) is ever placed on the leads 44 which could damage or bend the leads. Instead, the package is trapped by external pressure applied on the tops of the feet with bosses 57. Since this pressure is exerted directly opposite the supporting surfaces of beams 70, no bending stresses are ever applied to the terminal leads 44. Since pressure plate 56 is pivotally mounted in lid 50, the pressure exerted on leads 44 on opposite sides (ends) of the package 41 is evenly distributed as the lid 50 is moved toward the closed position. However, as the pressure plate moves downwardly into the cavity 30 (moving package 41 deeper into the cavity 30) the curved mid-sections of the beams 70 are flattened. Since the feet 46 are in contact with the top surfaces of the terminal beams and move in a straight line downwardly, flattening of the beams 70 causes relative movement between the undersurface of each foot 46 and the surface of the terminal lead 70 with which it is in contact. To clean the undersurface of the foot 46 and assure good electrical communication therebetween, the top surface is roughened to form an abrasive surface which scrubs oxide films and the like from each foot 46 as it moves relative to the foot.

In the preferred embodiment, micro-grooves 69 are formed in the top surfaces of the free ends 73 and adjacent mid-sections 75 of beams 70 as shown in FIG. 5. The micro-grooves may be formed by any conventional method such as stamping, etching, knurling, machining (with laser or mechanically) or the like to form a plurality of substantially parallel grooves 69 which traverse the top surface of the beam 70 at an angle with respect to the longitudinal axis of the beam. The grooves 69 are preferably about 0.005 inch wide, about 0.001 inch deep and positioned on centers spaced about 0.01 inch apart. The grooves 69 are also preferably formed to have sharp edges and aligned at an angle of from about 20° to about 80° (preferably about 45°) from the longitudinal axis of the beam 70 so that as the beam moves (with respect to feet 46) when the beam is flattened, the edges of the micro-grooves 69 scrape the undersides of the feet 46 to remove oxide films or other barriers which would prevent good electrical contact. By aligning the grooves 69 at an angle with respect to the longitudinal axis of the beam 70, scrapings trapped within the grooves are forced outwardly by subsequent scrapings and the grooves 69 become self-cleaning. In order to evenly distribute stresses on the beam 70 a second set of parallel grooves 69a may be formed at an opposite but equal angle from the axis of the beam as shown in FIG. 6.

The components of support housing 20 are preferably dimensioned to position feet 46 at or near the ends 73 of the beams 70 when the lid 50 is open (as shown in FIG. 3) and to substantially flatten the beams 70 against the surface of base 21 when the lid 50 is in the closed position as shown in FIG. 4. This insures that sufficient relative movement occurs between the beams 70 and feet 46 to properly clean the undersides of the feet and that the package 41 is securely trapped within the housing 20 in the closed position. The support housing is maintained in the closed position by rotating latch plate 80 to position latch hook 86 in engagement with lip 85 on top plate 22. In this position, the device package 41 is securely locked in the housing 20 with its terminal leads 44 in electrical connection with terminal beams 70 for testing, burn-in or any other processing desired.

It should be noted that the support housing 20 is designed to hold the device package 41 by only contacting the foot ends of leads 44. Thus, no pressure is ever applied to the package body 41. Accordingly, the likelihood of damage to body 41 or bending leads 44 is virtually eliminated.

The general structure of the support housing 20 illustrated may be used for all surface mount packages. Since the free ends of the terminal beams 70 approach and contact the terminal feet from the bottom, similar arrangements may be used in J-lead, BGA and LGA packages. In mounting the packages, however, pressure must be applied to the top surface of the package since the terminal feet are arranged below the bottom surface of the package.

The principles of the invention may be employed in various arrangements to obtain the benefits of the advantages and features disclosed. It is to be understood, therefore, that although numerous characteristics and advantages of the invention have been set forth together with details of the structure and function of various embodiments of the invention, this disclosure is illustrative only. Various changes and modifications may be made in detail, especially in matters of shape, size and arrangement of parts, without departing from the spirit and scope of the invention as defined by the appended claims.

What is claimed:

1. A support housing for electronic device packages having terminal feet extending therefrom comprising:
    (a) a plurality of elongated, resilient, electrically conductive terminal beams;
    (b) an abrasive surface on each said beam aligned to slideably engage at least one of the terminal feet of an electronic device package when the device package is positioned in the support housing, each said abrasive surface being formed with a plurality of grooves, each said groove defining at least one sharp edge generally facing the center of the support housing; and
    (c) means to cause relative movement between said terminal feet and the abrasive surface of said terminal beams while maintaining physical contact therebetween.

2. A support housing as defined in claim 1 wherein said grooves are oriented at a self-cleaning angle.

3. A support housing as defined in claim 1 wherein said grooves are substantially parallel and aligned at an angle of from about 20° to about 80° with respect to the elongated direction of the terminal beam.

4. A support housing as defined in claim 3 wherein said grooves are oriented at an angle of 45° with respect to the elongated direction of the terminal beam.

5. A support housing as defined in claim 1 wherein said grooves are about 0.005 inch wide, about 0.001 inch deep and positioned on centers about 0.01 inch apart.

6. A mounting support for electronic device packages having a plurality of terminal leads arranged in a pattern comprising:
    (a) a base;
    (b) a plurality of substantially parallel, elongated, resilient, electrically conductive terminal beams, each beam having a first end secured to said base, a second end spaced from said base and an intermediate curved section having a roughened surface connecting said first and second ends, said roughened surface being formed with a plurality of grooves, each said groove defining at least one sharp edge generally facing the center of the mounting support;
    (c) structure which individually aligns said beams with terminal leads arranged in a pattern on an electronic device package when said package is positioned in the mounting support; and
    (d) closure means for urging said terminal leads into physical contact with the roughened surfaces of said terminal beams and simultaneously urging said second ends toward said base to cause relative movement between said roughened surfaces and said terminal leads while said roughened surfaces are in contact with said terminal leads.

7. A mounting support as defined in claim 6 wherein said grooves of each said plurality of grooves are substantially parallel and aligned at a first angle with respect to the longitudinal axis of the terminal beam.

8. A mounting support as defined in claim 6 wherein said grooves are about 0.001 inch deep, about 0.005 inch wide and positioned on centers spaced about 0.01 inch apart.

9. A mounting support as defined in claim 7 wherein said substantially parallel grooves are aligned at an angle of from about 20° to about 80° from the longitudinal axis of the terminal beam.

10. A mounting support as defined in claim 7 wherein each said plurality of grooves is a respective first plurality of grooves, and wherein each said roughened surface is formed with a second plurality of substantially parallel grooves aligned at a second angle with respect to the longitudinal axis of the terminal beams.

11. A mounting support as defined in claim 10 wherein said second angle is the substantially equal opposite angle of said first angle.

12. A mounting support for surface mount electronic device packages having a major face and a plurality of mounting feet arranged in a pattern substantially parallel with such major face comprising:

(a) a base;

(b) a plurality of substantially parallel, elongated, resilient, electrically conductive terminal beams, each beam having a first end secured to said base, a second end spaced from said base and an intermediate curved section having a roughened surface connecting said first and second ends, said roughened surface being formed with a plurality of grooves, each said groove defining at least one sharp edge generally facing the center of the mounting support;

(c) structure which individually aligns said beams with feet arranged in a pattern substantially parallel with a major face of a surface mount device package when said package is mounted in the mounting support; and (d) closure means for urging said feet into physical contact with the roughened surfaces of said terminal beams.

13. A mounting support as defined in claim 12 wherein said grooves of each said plurality of grooves are substantially parallel and aligned at a first angle with respect to the longitudinal axis of the terminal base.

14. A mounting support as defined in claim 12 wherein said grooves are about 0.001 inch deep, about 0.005 inch wide and positioned on centers spaced about 0.01 inch apart.

15. A mounting support as defined in claim 13 wherein said substantially parallel grooves are aligned at an angle of from about 20° to about 80° from the longitudinal axis of the terminal beam.

16. A mounting support as defined in claim 12 wherein each said plurality of grooves is a respective first plurality of grooves, and wherein each said roughened surface is formed with a second plurality of substantially parallel grooves aligned at a second angle with respect to the longitudinal axis of the terminal beams.

17. A mounting support as defined in claim 16 wherein said second angle is the substantially equal opposite angle of said first angle.

18. A mounting support as defined in claim 10 wherein each said groove of each said second plurality of grooves defines at least one sharp edge generally facing the center of the mounting support.

19. A mounting support as defined in claim 16 wherein each said groove of each said second plurality of grooves defines at least one sharp edge generally facing the center of the mounting support.

\* \* \* \* \*